(12) United States Patent
Taniguchi et al.

(10) Patent No.: US 7,224,023 B2
(45) Date of Patent: *May 29, 2007

(54) SEMICONDUCTOR DEVICE AND METHOD OF MANUFACTURING THEREOF

(75) Inventors: Toshimitsu Taniguchi, Gunma (JP); Takashi Arai, Tochigi (JP); Masashige Aoyama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/806,610

(22) Filed: Mar. 23, 2004

(65) Prior Publication Data
US 2005/0118765 A1    Jun. 2, 2005

Related U.S. Application Data

(62) Division of application No. 09/652,044, filed on Aug. 31, 2000, now Pat. No. 6,784,059.

(30) Foreign Application Priority Data
Oct. 29, 1999   (JP) .................. P.11-309366

(51) Int. Cl.
H01L 29/76    (2006.01)
H01L 31/113   (2006.01)
H01L 31/062   (2006.01)
H01L 29/94    (2006.01)
H01L 31/119   (2006.01)

(52) U.S. Cl. ............ 257/328; 257/402; 257/404; 257/408

(58) Field of Classification Search ........... 257/328, 257/402–404, 408
See application file for complete search history.

(56) References Cited

U.S. PATENT DOCUMENTS

| 4,062,699 | A | | 12/1977 | Armstrong |
| 4,948,745 | A | | 8/1990 | Pfiester et al. |
| 5,517,046 | A | | 5/1996 | Hsing et al. |
| 5,567,629 | A | | 10/1996 | Kubo |
| 5,576,574 | A | * | 11/1996 | Hong ................ 438/291 |
| 5,688,700 | A | | 11/1997 | Kao et al. |
| 5,814,858 | A | | 9/1998 | Williams |
| 5,844,272 | A | | 12/1998 | Soderbarg et al. |
| 5,926,712 | A | | 7/1999 | Chen et al. |
| 6,033,944 | A | | 3/2000 | Shida |
| 6,060,362 | A | * | 5/2000 | Rhee ................ 438/301 |
| 6,242,787 | B1 | * | 6/2001 | Nakayama et al. ...... 257/493 |
| 6,259,136 | B1 | * | 7/2001 | Kawaguchi et al. ..... 257/336 |
| 6,635,925 | B1 | * | 10/2003 | Taniguchi et al. ...... 257/335 |

* cited by examiner

Primary Examiner—Sara Crane
Assistant Examiner—Samuel A. Gebremariam
(74) Attorney, Agent, or Firm—Fish & Richardson P.C.

(57) ABSTRACT

This invention is characterized in that, a gate electrode 27F formed on a P-type well 3 via a gate oxide film 9, a high-concentration N-type source layer and a high-concentration N-type drain layer 15 respectively formed apart from the gate electrode and a low-concentration N-type source layer and a low-concentration N-type drain layer respectively formed so that they respectively surround the N-type source layer and the N-type drain layer 10 and respectively parted by a P-type body layer formed under the gate electrode 27F are provided.

9 Claims, 14 Drawing Sheets

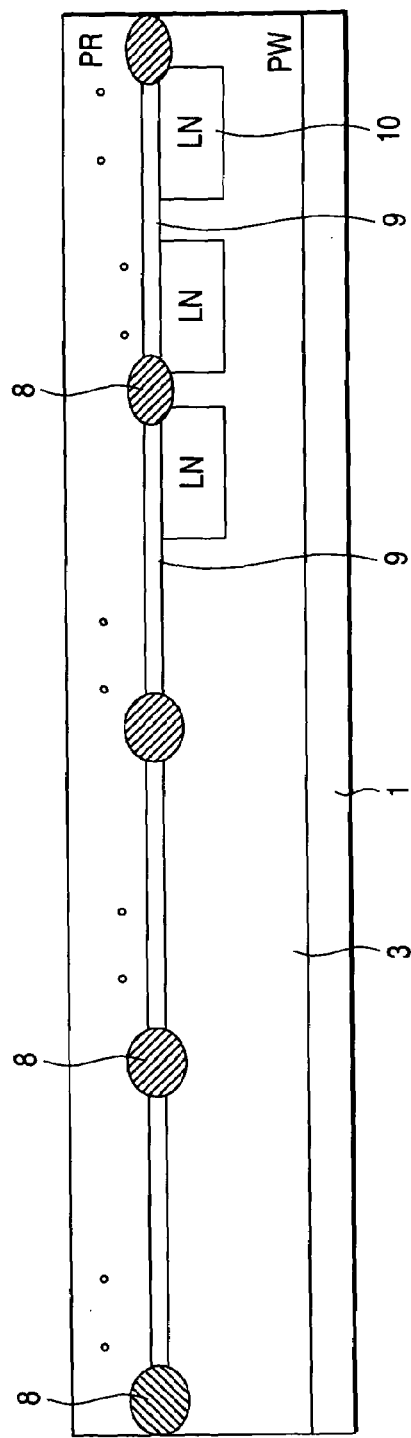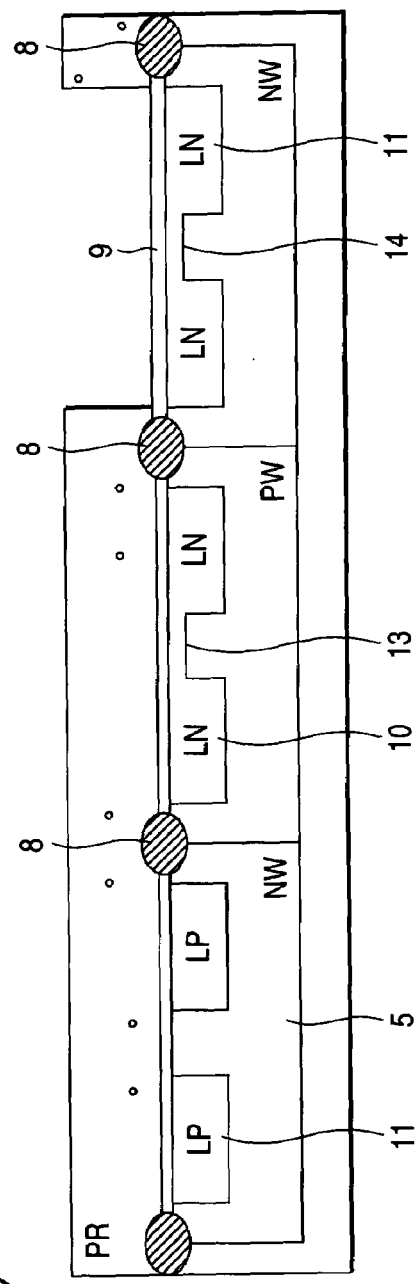
FIG. 3 (a)
FIG. 3 (b)

SEMICONDUCTOR DEVICE AND METHOD OF MANUFACTURING THEREOF

CROSS-REFERENCE TO RELATED APPLICATION(S)

This application is a divisional of U.S. Ser. No. 09/652,044, filed Aug. 31, 2000 now U.S. Pat. No. 6,784,059.

BACKGROUND OF THE INVENTION

1. Field of the Invention

The present invention relates to a semiconductor device and its manufacturing method, further detailedly relates to technique for integrating various type of MOS transistors composing a driver for driving a liquid crystal for example on one semiconductor substrate.

2. Description of the Related Art

Referring to the drawings, a conventional type semiconductor device and its manufacturing method will be described below. The driver for driving a liquid crystal described above is composed of an N-channel MOS transistor and a P-channel MOS transistor which are respectively a logic device of 3 V for example, an N-channel MOS transistor and a P-channel MOS transistor respectively of 30 V for example which respectively have high resistance to voltage, an N-channel double-diffused (D) MOS transistor and a P-channel DMOS transistor and an N-channel MOS transistor of 30 V for example for a level shifter and others.

As for the DMOS transistor structure described above, impurities different in a conductive type are diffused into a diffused layer formed on the side of the main surface of a semiconductor substrate so as to form a new diffused layer, difference in diffusion in the lateral direction of these diffused layers is utilized for effective channel length and a short channel is formed to be a device in which on-state resistance is reduced.

FIG. 14 is a sectional view for explaining a conventional type MOS transistor and shows the structure of an N-channel DMOS transistor as an example. The description of the structure of a P-channel MOS transistor is omitted, however, it is well-known that a P-channel MOS transistor is different only in a conductive type from an N-channel MOS transistor and has the similar structure.

As shown in FIG. 14, a reference numeral 51 denotes a semiconductor substrate of one conductive type, for example a P type, 52 denotes an N-type well, a P-type body layer 53 is formed in the N-type well 52, an N-type diffused layer 54 is formed in the P-type body layer 53 and an N-type diffused layer 55 is formed in the N-type well 52. A gate electrode 57 is formed on the surface of the substrate via a gate oxide film 56 and a channel layer 58 is formed in the superficial area of the P-type body layer 53 immediately under the gate electrode 57.

The N-type diffused layer 54 functions as a source diffused layer, the N-type diffused layer 55 functions as a drain diffused layer and the N-type well 52 under an oxide film 59 according to LOCOS method functions as a drift layer. Reference numerals 60 and 61 respectively denote a source electrode and a drain electrode, 62 denotes a P-type diffused layer for acquiring the electric potential of the P-type body layer 53 and 63 denotes a layer insulating film.

In the DMOS transistor described above, the concentration on the surface of the N-type well 52 is enhanced by diffusing impurities into it, as a result, current easily flows on the surface of the N-type well 52 and resistance to voltage can be enhanced.

The DMOS transistor having such structure is called surface relaxation-type ((REduced SURface Field: RESURF) DMOS and the concentration of dopants in the drift layer of the N-type well 52 is set so that it meets a condition of RESURF. Such technique is disclosed in JP-A-9-0.139438 and others.

In the DMOS transistor described above is formed, high temperature heat treatment for forming the P-type body layer 53 is required after a gate electrode is formed, therefore, as the concentration in a profile ruled every 0.35 μm for example in a microdevice operated at low voltage gets out of order, a micro MOS transistor starts to be formed in the present circumstances after a gate electrode of a DMOS transistor is formed and high temperature heat treatment for forming a P-type body layer is finished and there is a problem that a manufacturing process is extended.

As the gate length of the DMOS transistor is basically determined by diffusion coefficients by different ions and a diffusion started position, there is also a problem that the degree of the freedom in design of gate length is small.

SUMMARY OF THE INVENTION

The invention is made to solve the problems and a semiconductor device according to the invention is characterized in that, a gate electrode formed on a P-type well via a gate oxide film a high-concentration N-type source layer and a high-concentration N-type drain layer respectively formed apart from the gate electrode and a low-concentration N-type source layer and a low-concentration N-type drain layer respectively formed so that they respectively surround the N-type source layer and the N-type drain layer and respectively parted by a P-type body layer formed under the gate electrode are provided.

Also, the semiconductor device according to the invention is characterized in that, a gate electrode formed on a first conductive type well via a gate oxide film, a high-concentration N-type source layer formed so that it is adjacent to one end of the gate electrode, a high-concentration second conductive-type drain layer formed apart from the other end of the gate electrode, a low-concentration first conductive type drain layer extended from under the gate electrode and formed so that the low-concentration second conductive type drain layer surrounds the second conductive type drain layer and a second conductive type body layer formed between the second conductive type source layer under the gate electrode and the second conductive type drain layer are provided.

Preferably the step of forming the second conductive type body layer is formed by ion implantation.

According to the above feature, although channel length is determined as a one value in the convenient thermal procedure, since channel length can be determined more freely with respect to gate length according to designing the body layer, in comparison with the conventional method.

Further since the body layer of the present invention is formed only below the gate electrode, junction capacity can be reduced in comparison with the conventional body layer formed so as to cover the high concentration source layer.

Furthermore, high temperature thermal procedure for forming the body layer after forming the gate electrode is not required, hybrid integration with very small sized process can be realized.

Further, preferably p type layer for controlling a threshold voltage is formed on a surface portion (channel region) of the N type body layer is formed.

According to the above feature, a driving ability of p channel DMOS transistor normally being inferior to n channel DMOS transistor can be improved.

According to the present invention, by forming impurity layer of each conduction type in each of the channel layers corresponding to the conduction type of the body layers, the driving capability of reverse conduction type of transistors formed on a substrate can be made uniform.

In the same conduction type of transistors which are different size, by forming impurity layer of conduction type in the channel layers of the body layers, the driving capability can be controlled.

BRIEF DESCRIPTION OF THE DRAWINGS

FIG. 3 are sectional views showing the method of manufacturing the semiconductor device equivalent to the embodiment of the invention;

DESCRIPTION OF THE PREFERRED EMBODIMENTS

Figure 1A:
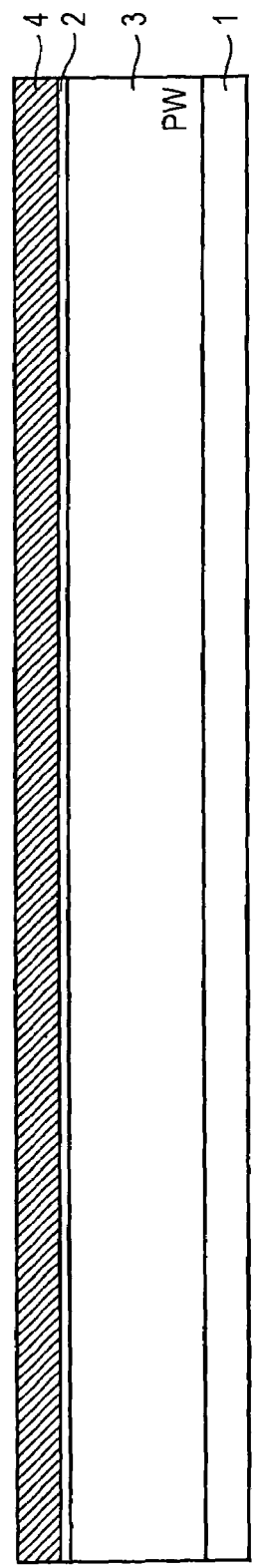
FIG. 1 are sectional views showing a method of manufacturing a semiconductor device equivalent to an embodiment of the invention.

Referring to the drawings, an embodiment of a semiconductor device and its manufacturing method according to the invention will be described below.

Figure 10A:
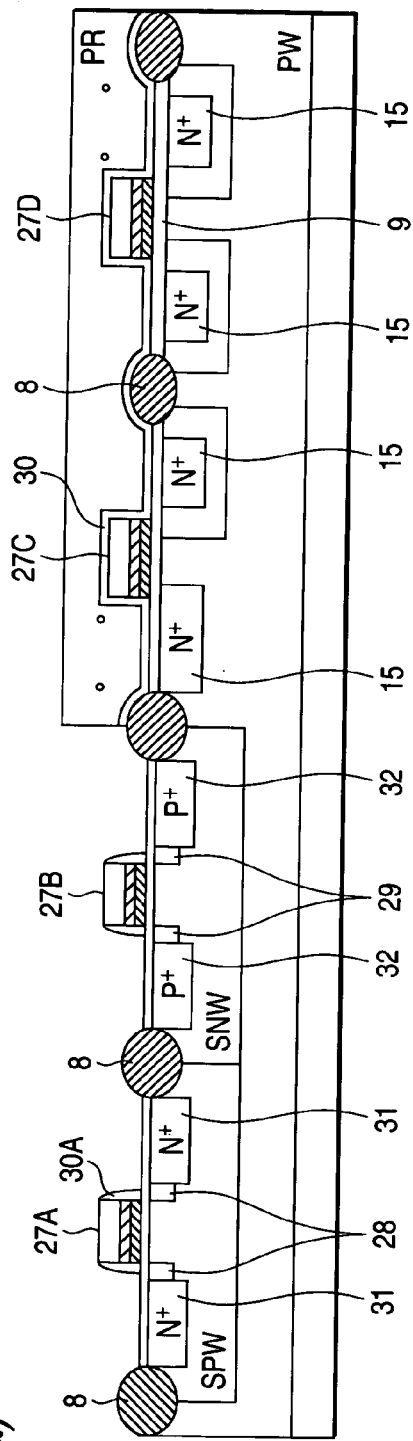
FIG. 10 are sectional views showing the method of manufacturing the semiconductor device equivalent to the embodiment of the invention.
Figure 10B:
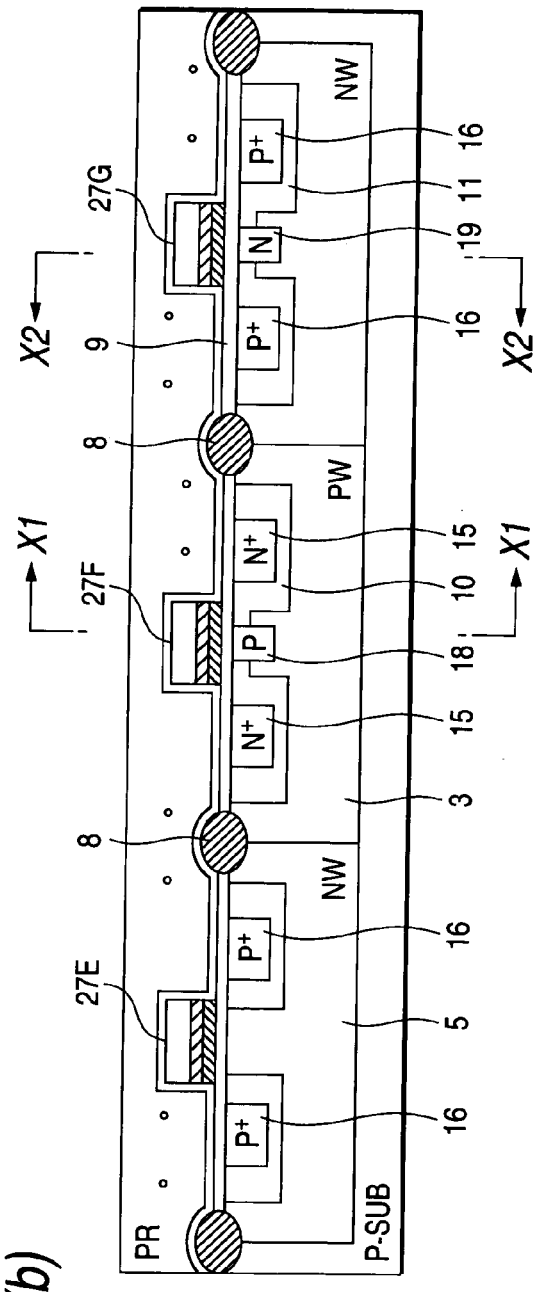

A semiconductor device according to the invention shown in FIG. 10, that is, a driver for driving a liquid crystal is composed of an N-channel MOS transistor and a P-channel MOS transistor which are respectively a logic device of 3 V for example, an N-channel MOS transistor for a level shifter of 30 v for example, an N-channel MOS transistor of 30 V for example which has high resistance to voltage respectively in order from the left side in FIG. 10A, a P-channel MOS transistor of 30 V for example which has high resistance to voltage respectively, an N-channel DMOS transistor and a P-channel DMOS transistor respectively similarly in order from the left side in FIG. 10B.

A method of manufacturing various MOS transistors composing the driver for driving a liquid crystal will be described below. The semiconductor of the present invention is applicable to various drivers such as a liquid crystal driver.

Figure 1B:
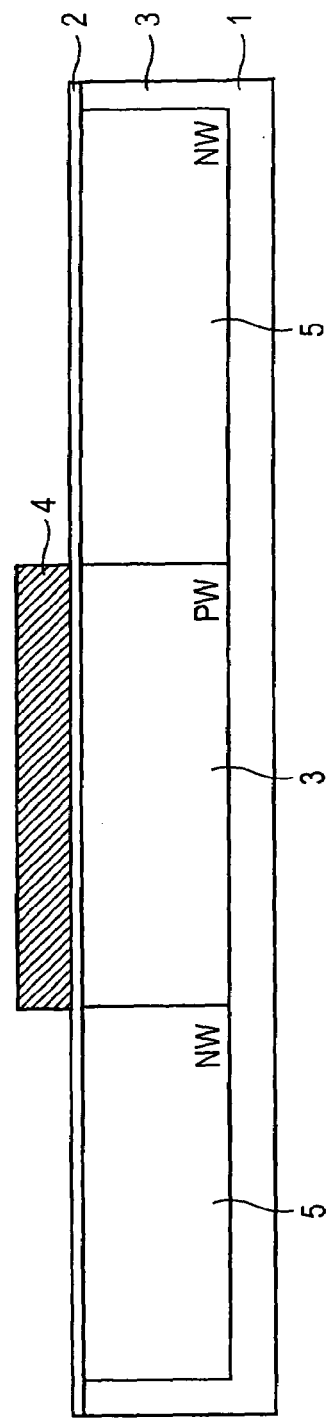

First, as shown in FIG. 1, to define an area for composing various MOS transistors, a P-type well (PW) 3 and an N-type well (NW) 5 are formed in a P-type semiconductor substrate (P-Sub) 1 for example.

That is, boron ions for example are implanted at the acceleration voltage of approximately 80 KeV under the implantation condition of $8 \times 10^{12}/cm^2$ in a state that an area where the N-type well in the substrate 1 is formed is covered with a resist film not shown via a pad oxide film 2. Afterward, phosphorus ions for example are implanted at the acceleration voltage of approximately 80 KeV under the implantation condition of $9 \times 10^{12}/cm^2$ in a state that the P-type well 3 is covered with a resist film 4 as shown in FIG. 1. Actually, the P-type well 3 and the N-type well 5 are formed by thermally diffusing each ion implanted as described above (for example, for four hours in the atmosphere of $N_2$ of 1150° C.).

Figure 2:
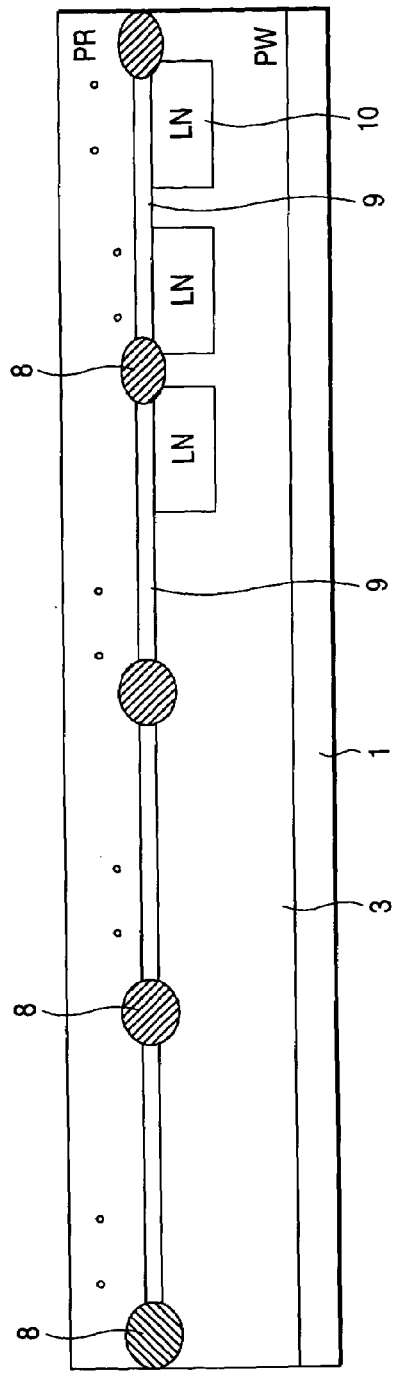
FIG. 2 are sectional views showing the method of manufacturing the semiconductor device equivalent to the embodiment of the invention.
Figure 2:
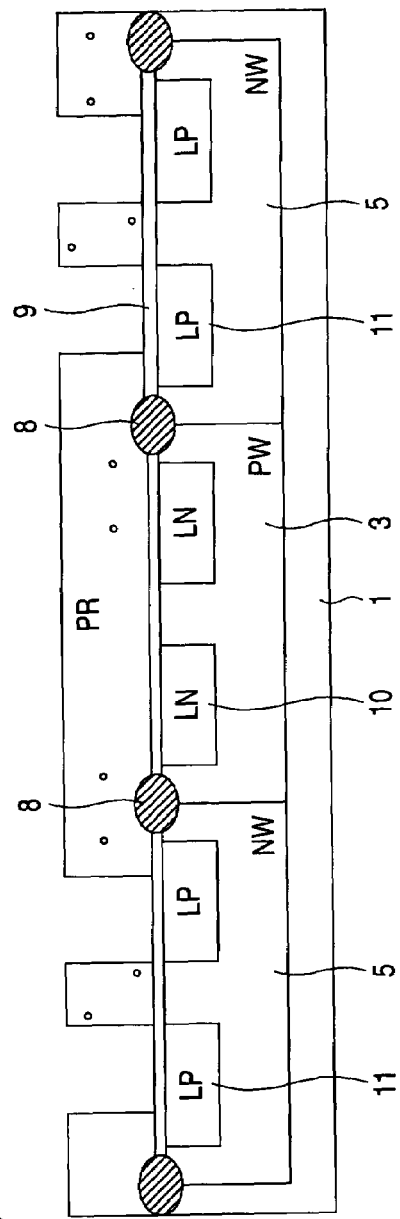

Next, as shown in FIG. 2, to separate every MOS transistor, a device separation film 8 of approximately 500 nm is formed according to LOCOS method and a thick gate oxide film 9 of approximately 80 nm for high resistance to voltage is formed on an active area except the device separation film 8 by thermal oxidation.

Next, a first low concentration N-type and P-type source/drain layers (hereinafter called an LN layer 10 and an LP layer 11) are formed using a resist film as a mask. That is, first, phosphorus ions for example are implanted into the superficial layer of the substrate at the acceleration voltage of approximately 120 KeV under the implantation condition of $8 \times 10^{12}/cm^2$ in a state that an area except an area where the LN layer is formed is covered with a resist film not shown so as to form the LN layer 10. Afterward, boron ions for example are implanted into the superficial layer of the substrate at the acceleration voltage of approximately 120 KeV under the implantation condition of $8.5 \times 10^{12}/cm^2$ in a state that an area except an area where the LP layer is formed is covered with a resist film (PR) so as to form the LP layer 11. Actually, each ion implanted as described above is thermally diffused after an annealing process (for example, for two hours in the atmosphere of $N_2$ of 1100° C.) which is a postprocess to be the LN layer 10 and the LP layer 11.

Next, as shown in FIG. 3, a second-low concentration N-type source drain layers (hereinafter called an SLN layer 13) are formed between the LN layers 10 using a resist film as a mask and a second-low concentration P-type source drain layers (hereinafter called an SLP layer 14) is formed between the LP layers 11 using a resist film as a mask. That is, first phosphorus ions for example are implanted into the superficial layer of the substrate at the acceleration voltage of approximately 120 KeV under the implantation condition of $1.5 \times 10^2/cm^2$ in a state that an area except an area where the SLN layer is formed is covered with a resist film not shown so as to form the SLN layer 13 which ranges to the LN layer 10. Afterward, boron difluoride ions for example are implanted into the superficial layer of the substrate at the acceleration voltage of approximately 140 KeV under the implantation condition of $2.5\times10^{12}/cm^2$ in a state that an area except an area where the SLP layer is formed is covered with a resist film (PR) so as to form the SLP layer 14 which ranges to the LP layer 11. The impurity concentration of to the LN layer 10 and the SLN layer 13, or the LP layer 11 and the SLP layer 14 are set respectively substantially equal or one of them is higher then others.

Figure 4:
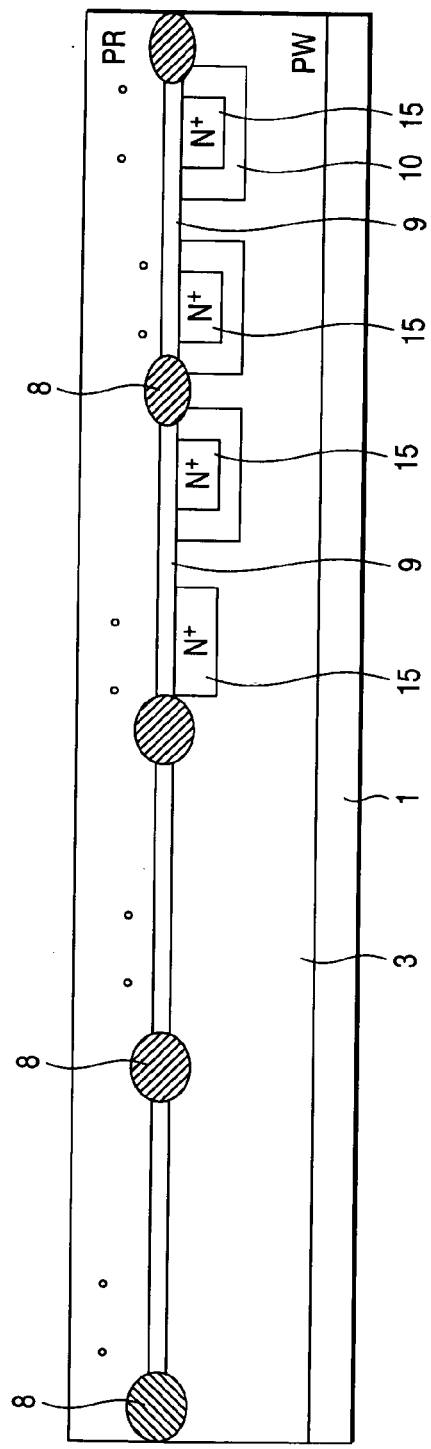
FIG. 4 are sectional views showing the method of manufacturing the semiconductor device equivalent to the embodiment of the invention.
Figure 4:
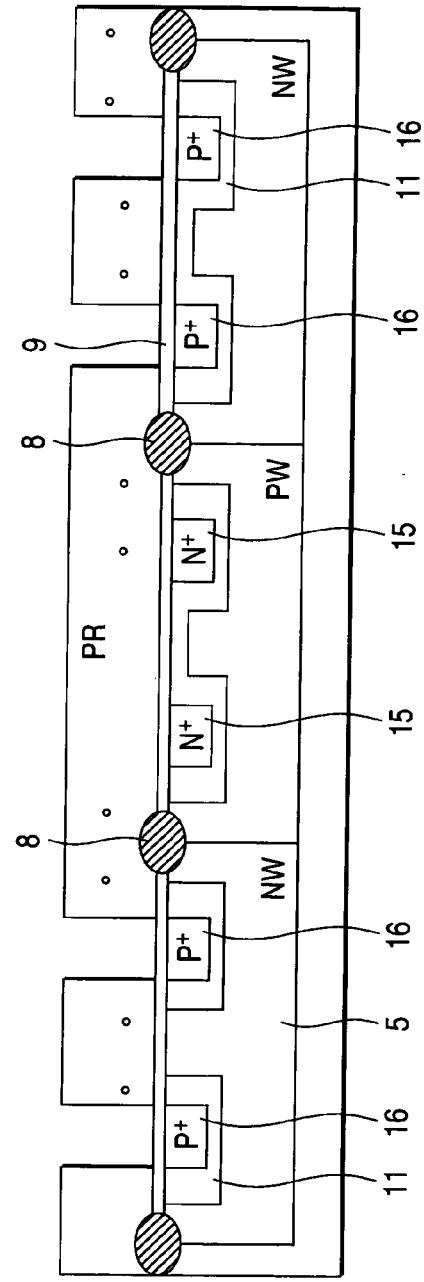

Further, as shown in FIG. 4, high concentration N-type and P-type source/drain layers (hereinafter called an N+ layer 15 and a P+ layer 16) are formed using a resist layer as a mask. That is, first, phosphorus ions for example are implanted into the superficial layer of the substrate at the acceleration voltage of approximately 80 KeV under the implantation condition of $2\times10^{15}/cm^2$ in a state that an area except an area where the N+ layer is formed is covered with a resist film not shown so as to form the N+ layer 15 which ranges to the LN layer 10. Afterward, boron difluoride ions for example are implanted into the superficial layer of the substrate at the acceleration voltage of approximately 140 KeV under the implantation condition of $2\times10^{15}/cm^2$ in a state that an area except an area where the P+ layer is formed is covered with a resist film (PR) so as to form the P+ layer 16.

Figure 5:
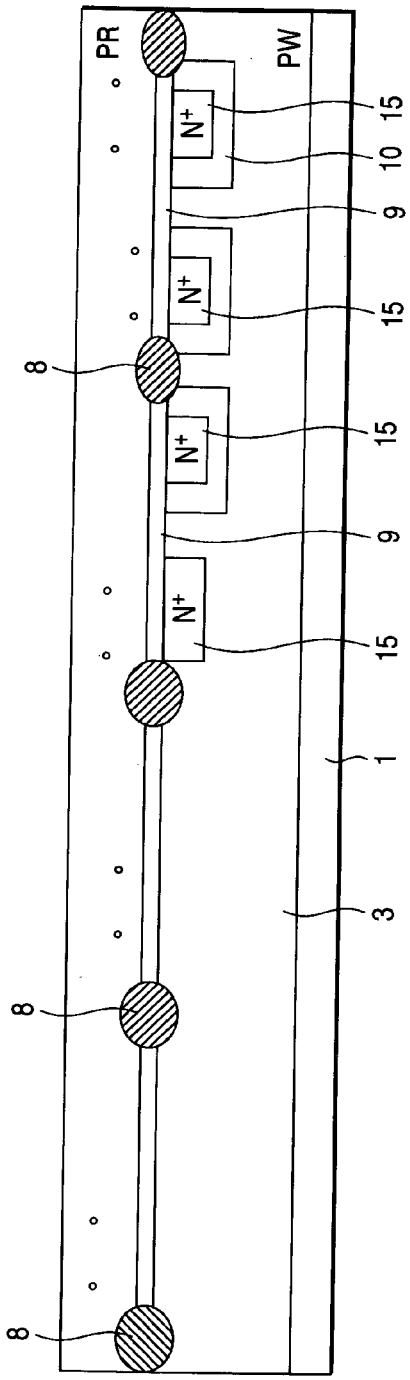
FIG. 5 are sectional views showing the method of manufacturing the semiconductor device equivalent to the embodiment of the invention.
Figure 5:
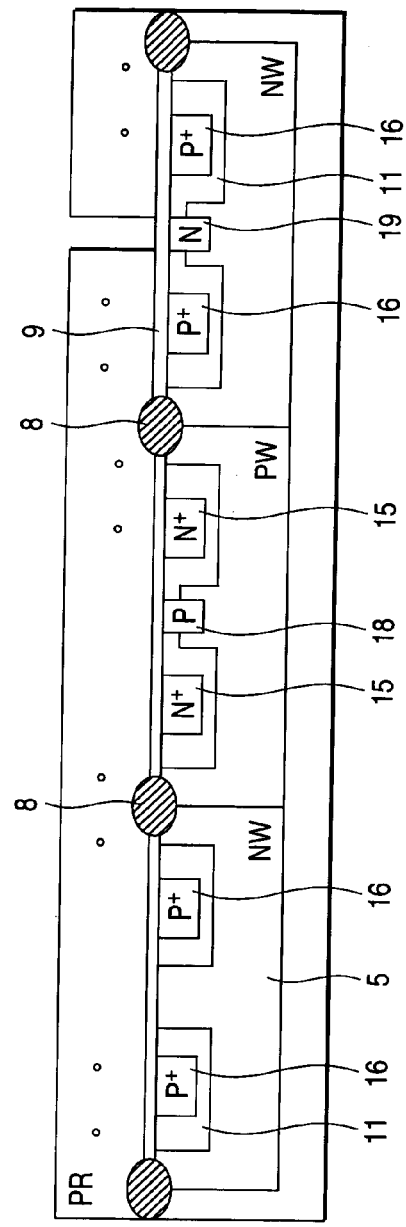
Figure 6:
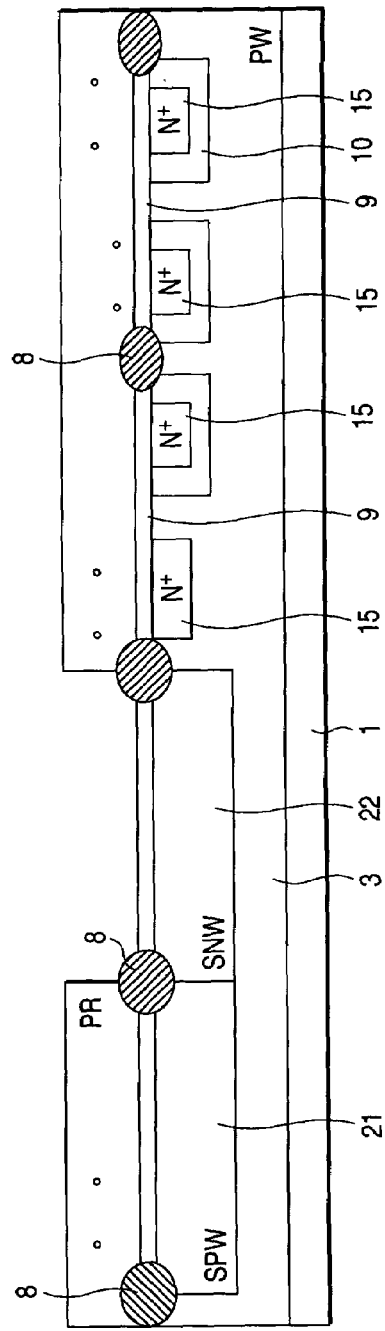
FIG. 6 are sectional views showing the method of manufacturing the semiconductor device equivalent to the embodiment of the invention.
Figure 6:
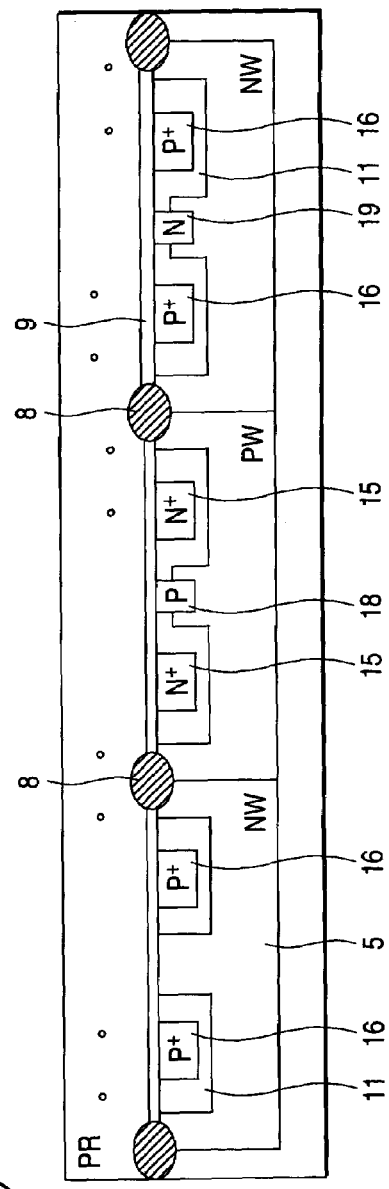

Next, as shown in FIG. 5, a P-type layer 18 (equivalent to the P-type body layer in conventional type structure) and an N-type layer 19 (equivalent to the N-type body layer in conventional type structure) respectively separating the SLN layer 13 and the SLP layer 14 are formed by doping impurities respectively of the reverse conductive type in the center of the SLN layer 13 which ranges to the LN layer 10 and in the center of the SLP layer 14 which ranges to the LP layer 11 by ion implantation using a resist film as a mask. That is, first, boron difluoride ions for example are implanted into the superficial layer of the substrate at the acceleration voltage of approximately 120 KeV under the implantation condition of $5\times10^{12}/cm^2$ in a state that an area except an area where the P-type layer is formed is covered with a resist film not shown so as to form the P-type layer 18. Afterward, phosphorus ions for example are implanted into the superficial layer of the substrate at the acceleration voltage of approximately 190 KeV under the implantation condition of $5\times10^{12}/cm^2$ in a state that an area except an area where the N-type layer is formed is covered with a resist film (PR) so as to form the N-type layer 19. The order of steps related to the ion implantation process shown in FIGS. 3 to 5 can be suitably varied.

Further, the second P-type well (SPW) 21 and a second N-type well (SNW) 22 are formed in the substrate (the P-type well 3) in areas where micro N-channel and P-channel MOS transistors are formed respectively for normal resistance to voltage.

That is, boron ions are similarly implanted into the superficial layer of the substrate at the acceleration voltage of approximately 50 KeV under a second implantation condition of $2.6\times10^{15}/cm^2$ in a state that an area except an area where the P-type layer is formed is covered with a resist film not shown so as to form the second P-type well 21 after boron ions for example are implanted into the P-type well 3 at the acceleration voltage of approximately 190 KeV under a first implantation condition of $1.5\times10^{13}/cm^2$ using a resist film not shown having its opening on an area where the N-channel MOS transistor is formed for normal resistance to voltage as a mask. Also, phosphorus ions for example are implanted into the P-type well 3 at the acceleration voltage of approximately 380 KeV under the implantation condition of $1.5\times10^{13}/cm^2$ using a resist film (PR) having its opening on an area where the P-channel MOS transistor is formed for normal resistance to voltage as a mask so as to form the second N-type well 22. In case a generator of the acceleration voltage of approximately 380 KeV is not provided, A double charging method in which bivalent phosphorus ion is implanted at the acceleration voltage of 190 keV under the implantation condition of $1.5\times10^{13}/cm^2$ may be also adopted. Subsequently phosphorus ion is implanted at the acceleration voltage of 150 keV under the implantation condition of $4.0\times10^{12}/cm^2$.

Figure 7:
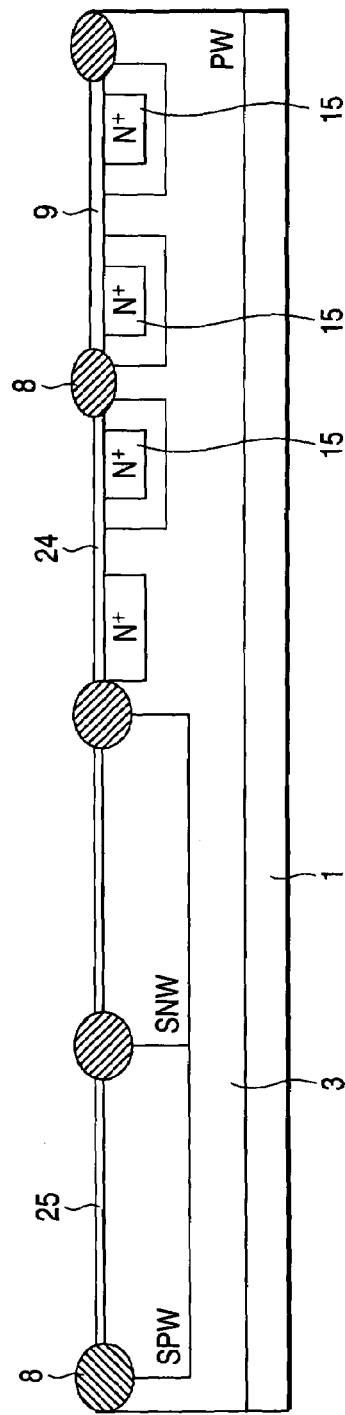
FIG. 7 are sectional views showing the method of manufacturing the semiconductor device equivalent to the embodiment of the invention.
Figure 7:
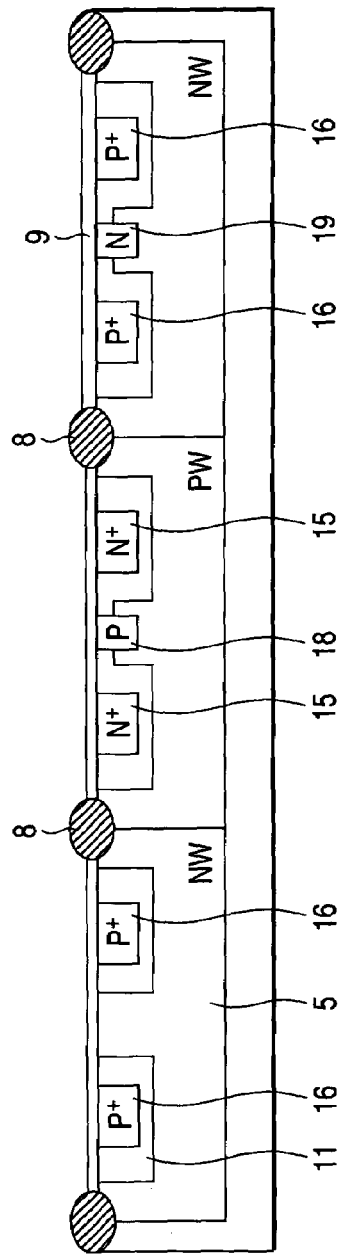

Next, as shown in FIG. 7, after the gate oxide film 9 on the areas where the N-channel and P-channel MOS transistors are formed respectively for normal resistance to voltage and on an area where an N-channel MOS transistor for a level shifter is formed is removed, a gate oxide film having desired thickness is newly formed on the areas.

That is, first, a gate oxide film 24 of approximately 14 nm (approximately 7 nm at this stage, however, the thickness is increased when a gate oxide film for normal resistance to voltage described later is formed) is overall formed for the N-channel MOS transistor for the level shifter by thermal oxidation. Next, after the gate oxide film 24 of the N-channel MOS transistor for the level shifter formed on the areas where the N-channel and P-channel MOS transistors are formed respectively for normal resistance to voltage is removed, a thin gate oxide film 25 for normal resistance to voltage (of approximately 7 nm) is formed in this area by thermal oxidation.

Figure 8A:
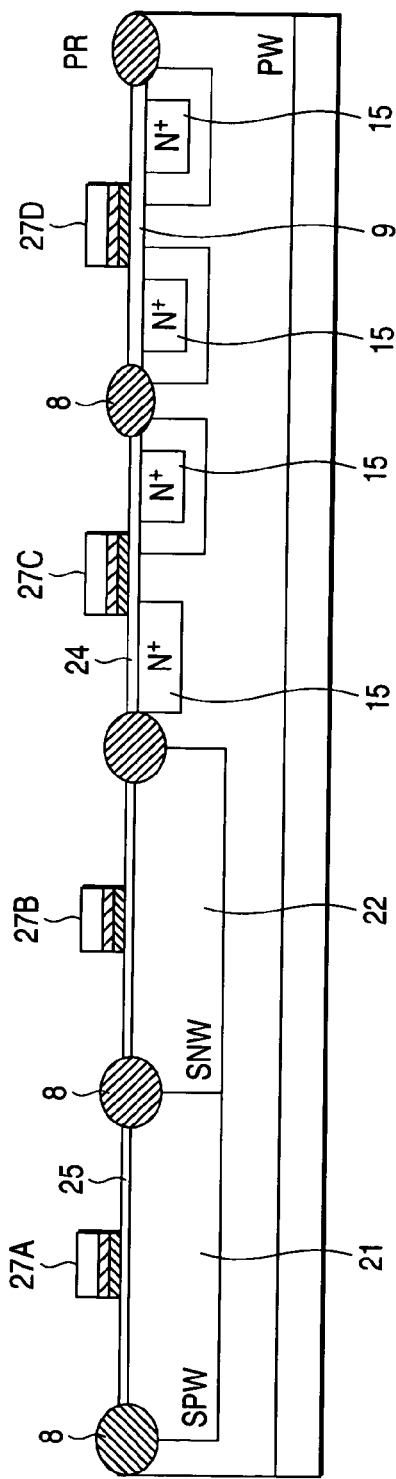
FIG. 8 are sectional views showing the method of manufacturing the semiconductor device equivalent to the embodiment of the invention.
Figure 8B:
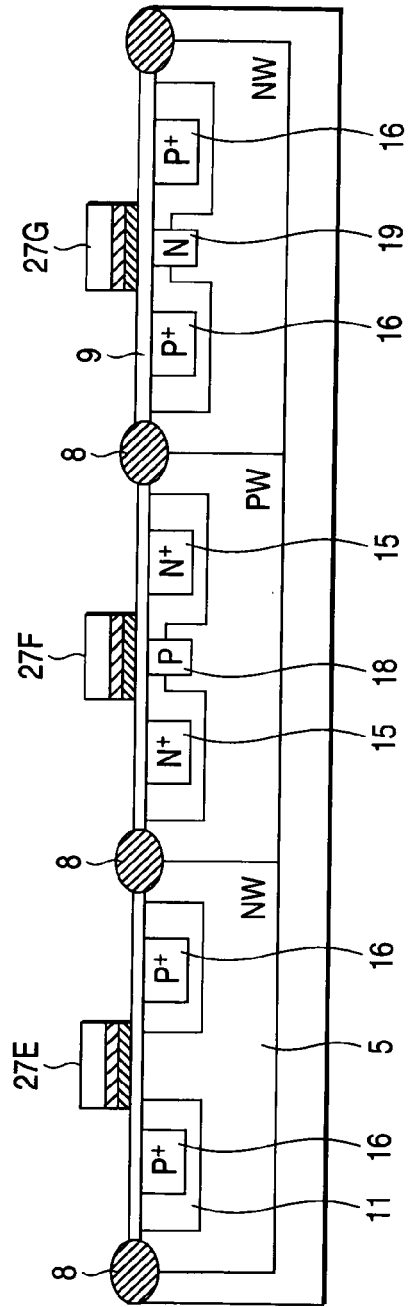

Next, as shown in FIG. 8, a polysilicon film of approximately 100 nm is overall formed and after $POCl_3$ is thermically diffused in the polysilicon film as a thermically diffused source and electricity is conducted in the polysilicon film, a tungsten silicide ($WSi_x$) film of approximately 100 nm and further, an $SiO_2$ film of approximately 150 nm are laminated on the polysilicon film, are patterned using a resist film not shown and gate electrodes 27A, 27B, 27C, 27D, 27E, 27F and 27G for each MOS transistor are formed. The $SiO_2$ film functions as a hard mask in patterning.

Figure 9:
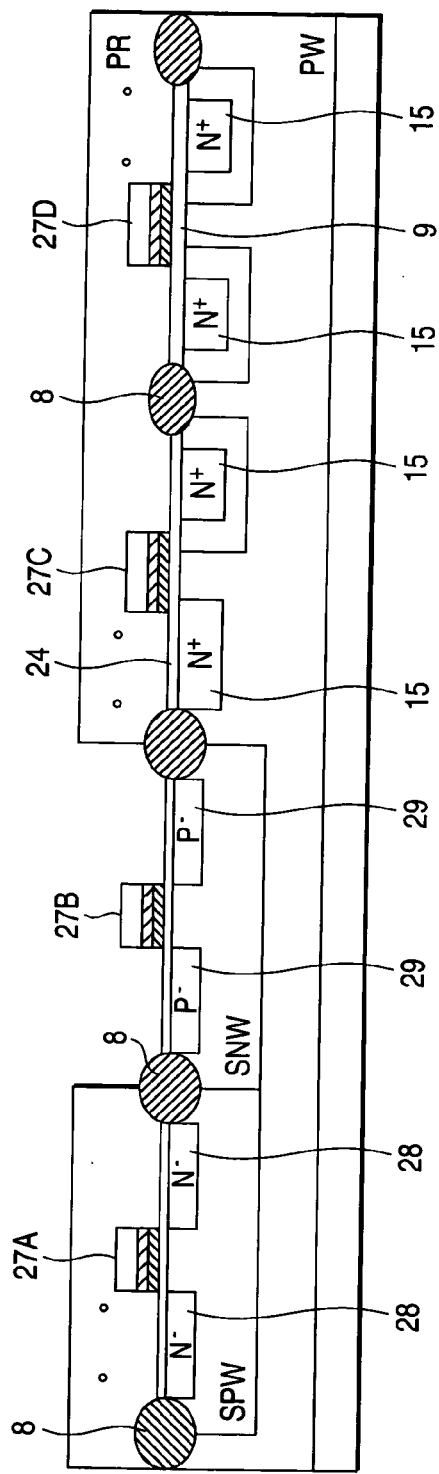
FIG. 9 are sectional views showing the method of manufacturing the semiconductor device equivalent to the embodiment of the invention.
Figure 9:
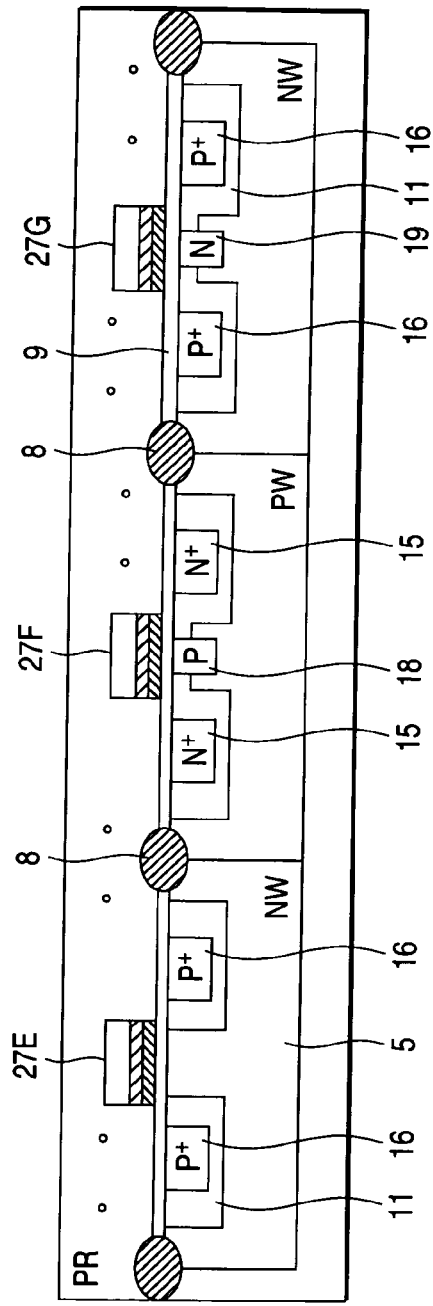

Next, as shown in FIG. 9, low concentration source/drain layers are formed for the N-channel and P-channel MOS transistors for normal resistance to voltage.

That is, first, phosphorus ions for example are implanted using a resist film not shown coating an area except areas where low concentration source/drain layers for an N-channel MOS transistor for normal resistance to voltage are formed as a mask at the acceleration voltage of approximately 20 KeV under the implantation condition of $6.2\times10^{13}/cm^2$ so as to form low concentration N-type source/drain layers 28. Also, boron difluoride ions for example are implanted using a resist film (PR) coating an area except areas where low concentration source/drain layers for a P-channel MOS transistor for normal resistance to voltage are formed as a mask at the acceleration voltage of approximately 20 KeV under the implantation condition of $2\times10^{13}/cm^2$ so as to form low concentration P-type source/drain layers 29.

Further, as shown in FIG. 10, a TEOS film 30 of approximately 250 nm is overall formed by LPCVD so that the gate electrodes 27A, 27B, 27C, 27D, 27E, 27F and 27G are coated and is anisotropically etched using a resist film (PR) having an opening on the areas where the N-channel and P-channel MOS transistors for normal resistance to voltage are formed as a mask. Hereby, a side wall spacer film 30A is formed on both side walls of the gate electrodes 27A and 27B as shown in FIG. 10 and the TEOS film 30 is left in an area coated by the resist film (PR) as it is.

FIGS. 11A and 11B are X1-X1, and X2-X2 sectional views for showing width directions of the gate electrodes 27F and 27G of N channel type DMOS transistor and P channel type DMOS transistor shown in FIG. 10B. High concentration source/drain layers are formed for the N-channel and P-channel MOS transistors for normal resistance to voltage using the gate electrode 18A, the side wall spacer film 30A, the gate electrode 18B and the side wall spacer film 30A as a mask.

That is, arsenic ions for example are implanted using a resist film not shown coating an area except areas where high concentration source/drain layers for an N-channel MOS transistor for normal resistance to voltage are formed as a mask at the acceleration voltage of approximately 100 KeV under the implantation condition of $5 \times 10^{13}/cm^2$ so as to form high concentration N+-type source/drain layers 31. Also, boron difluoride ions for example are implanted using a resist film not shown coating an area except areas where high concentration source/drain layers for a P-channel MOS transistor for normal resistance to voltage are formed as a mask at the acceleration voltage of approximately 40 KeV under the implantation condition of $2 \times 10^{15}/cm^2$ so as to form high concentration P+-type source/drain layers 32.

The N-channel MOS transistor and the P-channel MOS transistor respectively for normal resistance to voltage, the N-channel MOS transistor for the level shifter, the N-channel MOS transistor and the P-channel MOS transistor respectively for high resistance to voltage, the N-channel DMOS transistor and the P-channel DMOS transistor respectively composing the driver for driving a liquid crystal are completed by forming a metallic wiring layer kept in contact with each high concentration source/drain layer 15, 16, 31 and 32 after a layer insulating film of approximately 600 nm composed of the TEOS film, a BPSG film and others is overall formed though the drawing is omitted.

Also, the source/drain layers structure is composed symmetrically regarding simplicity in the manufacturing process in the embodiment described above as important, however, the present invention is not limited to this and asymmetrical source/drain layers structure may be also adopted.

Figure 11:
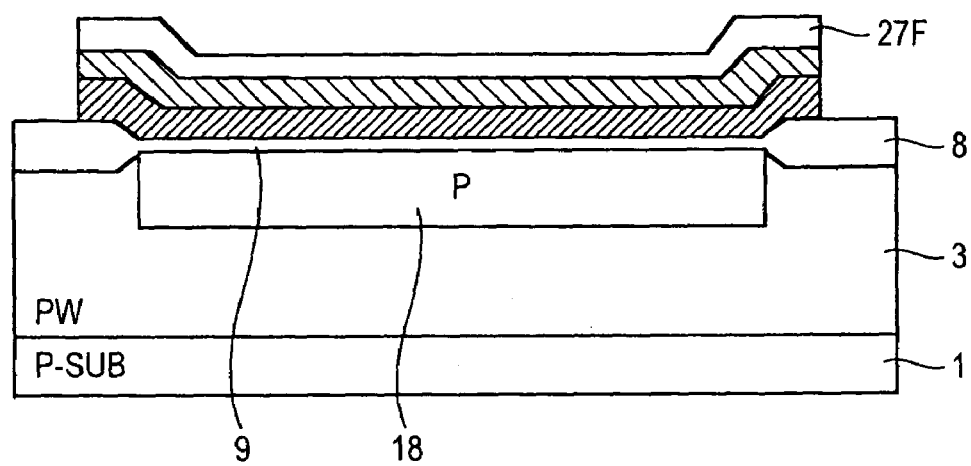
FIG. 11 are sectional views showing the method of manufacturing the semiconductor device equivalent to the embodiment of the invention.
Figure 11:
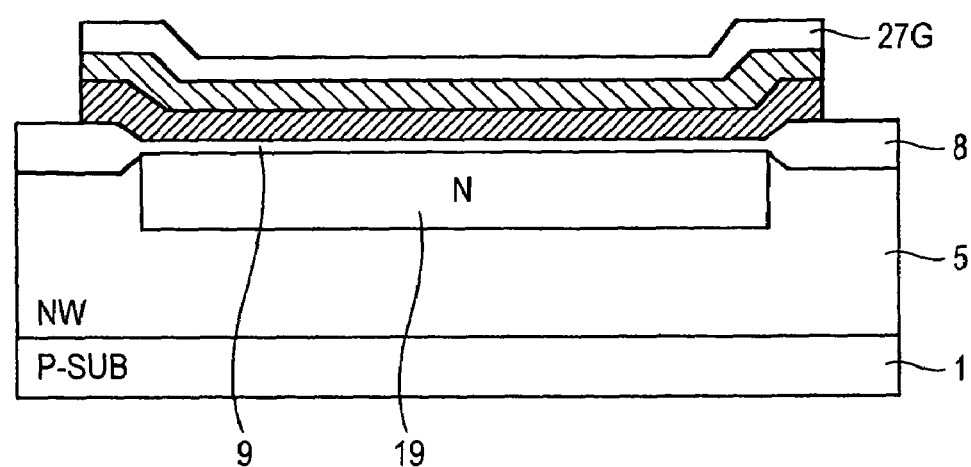
Figure 12:
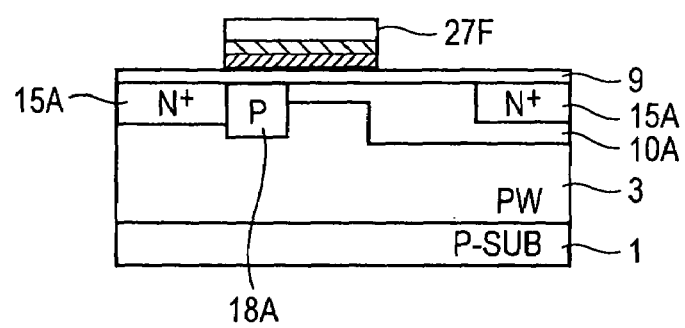
FIG. 12 are sectional views showing the method of manufacturing the semiconductor device equivalent to the another embodiment of the invention.
Figure 12:
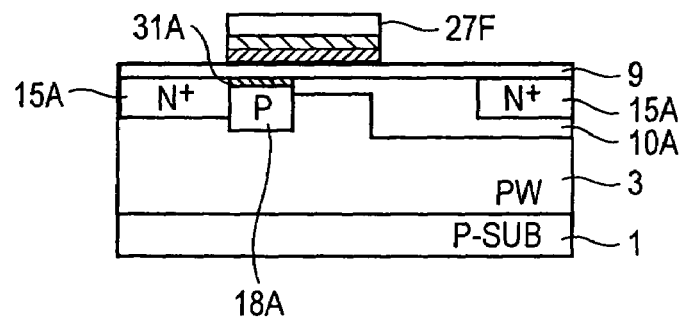

That is, a semiconductor device equivalent to another embodiment in this case is characterized in that to explain an N-channel DMOS transistor for an example, as shown in FIG. 12A a gate electrode 27F formed on a P-type semiconductor substrate 1 for example via a gate oxide film 9, a high concentration N-type source layer 15A formed so that it is adjacent to one end of the gate electrode 27F, a high concentration N-type drain layer 15A formed apart from the other end of the gate electrode 27F, a low concentration N-type drain layer 10A extended from under the gate electrode 27F and formed so that the low concentration N-type drain layer surrounds the N-type drain layer 15A and a P-type body layer 18A under the gate electrode 27F formed between the N-type source layer 15A and the N-type drain layer 10A are provided as shown in FIG. 11.

As for its manufacturing method, after N-type impurities (for example, phosphorus ions) are implanted into a P-type well 3 for example and a low concentration N-type drain layer 10A is formed, N-type impurities (for example, arsenic ions) are implanted into the substrate 1, a high concentration N-type source layer 15A is formed so that it is adjacent to one end of a gate electrode 27F and a high concentration N-type drain layer 15A is formed in a position apart from the other end of the gate electrode 27F. Next, P-type impurities (for example, boron ions) are implanted into the substrate 1 and a P-type body layer 18A is formed from under one end of the gate electrode 27F so that the P-type body layer is adjacent to the N-type source layer 15A. After a gate oxide film 9 is formed on the P-type well 3, the gate electrode 27F has only to be formed on the gate oxide film 9.

As described above, in the structure according to the invention, as the P-type body layer or the N-type body layer is formed only under the gate electrode in the N-channel DMOS transistor and the P-channel DMOS transistor, the quantity of junction can be reduced, compared with the conventional type structure where the high concentration source layer is wrapped by the P-type body layer or the N-type body layer.

Also, as in the structure described above, the P-type body layer or the N-type body layer is formed by ion implantation, microminiaturization is enabled, compared with a conventional type formed by diffusion.

Further, according to the manufacturing method described above, as high temperature heat treatment after the gate electrode for forming the body layer is formed when the DMOS transistor is formed as in a conventional method is not required, compatibility with a microminiaturizing process is enabled.

Also, although channel length is determined as a one value in the convenient thermal procedure, in the method of manufacturing the DMOS transistor according to the invention, as the P-type body layer or the N-type body layer is formed after its own ion implantation process as described above, the degree of the freedom in design of gate length is increased, compared with the conventional method.

According to the invention, as the P-type body layer or the N-type body layer is formed only under the gate electrode in the MOS transistor having high resistance to voltage, the quantity of junction can be reduced, compared with the conventional type structure where the high concentration source layer is wrapped (surrounded) by the P-type body layer or the N-type body layer.

Also, as high temperature heat treatment after the gate electrode for forming the body layer is formed when the MOS transistor having high resistance to voltage is formed as in the conventional method is not required, compatibility with a microminiaturizing process is enabled, and various drivers for a display element (for example, a driver for displaying a liquid crystal) and a controller can be integrated into one chip.

Figure 13:
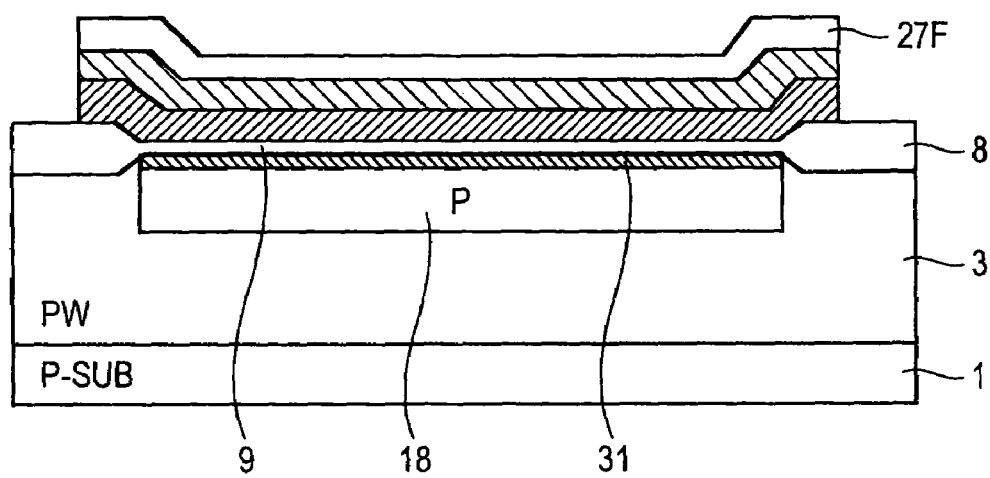
FIG. 13 is a sectional view showing a method of manufacturing a semiconductor device equivalent to the other embodiment of the invention.
Figure 13:
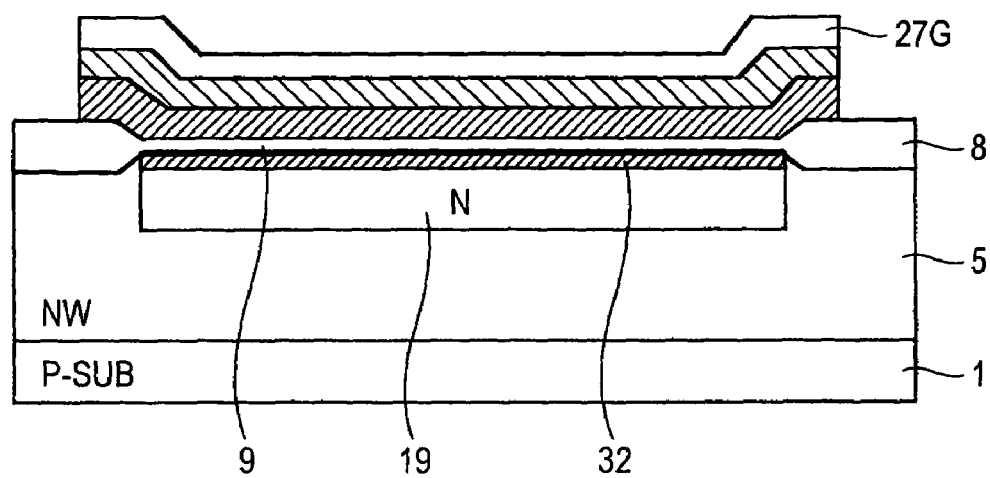
Figure 14:
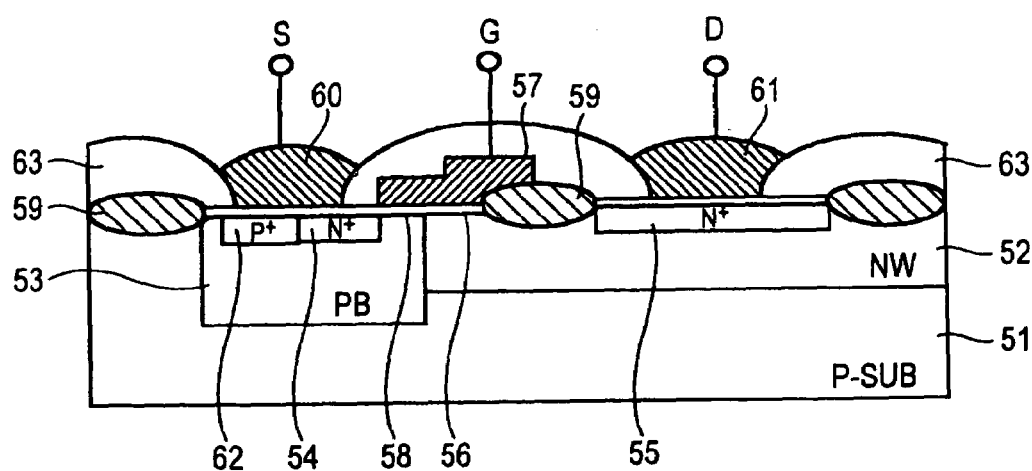
FIG. 14 is a sectional view showing a conventional type semiconductor device.

Next, another embodiment of the present invention will be explained referring to the FIGS. 12B, 13A, and 13B.

In the embodiment, it is characterized in that N type layer 31, 31A and P type layer 32 for controlling threshold voltage are formed in a surface portion (channel region) of P type body layer 18,18A and N type body layer 19 of the N channel type DMOS transistor and the P type DMOS transistor. Explanation using drawing is omitted. P channel type DMOS transistor is as same as the N channel type DMOS transistor as shown in FIGS. 12A and 12B, except for conduction type.

According to the above DMOS transistor, by forming an impurity region which has an reverse conduction type to that of the body layer, threshold voltage can be lowered and the driving capability can be improved.

In the step of forming a body layer, using an ion implantation is preferable. But in another doping step not only ion implantation but also diffusing step from gas phase or solid phase can be used. Further in the DMOS transistors, by forming impurity layer of each conduction type in each of the channel layers corresponding to the conduction type of the body layers, the driving capability of reverse conduction type of transistors formed on a substrate can be made uniform.

In the same conduction type of DMOS transistors, by forming impurity layer of reverse conduction type in the channel layers of the body layers, the driving capability can be controlled.

According to the present invention, by forming a thin p type impurity region in a channel layer in each of the conduction type of body controlling the driving capability in the N channel DMOS transistor, the driving capability of the P-channel type DMOS transistor which is inferior to that of the N-channel type DMOS transistor can be improved. Further by controlling an impurity concentration of P type layer, the driving capability of the P-channel type DMOS transistor can be set same as that of the N-channel type DMOS transistor. Therefore it is not required to apply a high voltage in order to improve a switching characteristic of p channel type DMOS transistor. This invention has an advantage that low voltage driving can be performed.

What is claimed is:

1. A semiconductor device comprising:
   high concentration source and drain layers of a reverse conductive type formed in a semiconductor layer of one conductive type,
   a gate electrode formed on a channel layer located between the source and drain layers,
   a body layer of one conductive type in direct contact with the high concentration source layer, and
   a low concentration drain layer of the reverse conductive type formed between the channel layer and the high concentration drain layer, wherein:
   said body layer is formed only under said gate electrode.

2. A semiconductor device, according to claim 1, wherein the gate electrode is formed on the channel layer via a gate oxide film;
   wherein the high concentration source layer is adjacent to one end of said gate electrode;
   wherein the high concentration drain layer is formed apart from an other end of said gate electrode;
   wherein the low concentration drain layer extends from under said gate electrode and surrounds said high concentration drain layer; and
   wherein the body layer is formed between said high concentration source layer and said high concentration drain layer.

3. A semiconductor device according to claim 1, wherein:
   said low concentration drain layer is shallow under said gate electrode and deep under said high concentration drain layer.

4. A semiconductor device, according to claim 1, wherein a reverse conductive type layer is formed in a surface portion of the body layer.

5. A semiconductor device comprising:
   high concentration source and drain layers of a reverse conductive type formed in a semiconductor layer of one conductive type;
   a gate electrode on a channel layer located between the high concentration source and drain layers and formed via a gate oxide film;
   a body layer of one conductive type formed only under the gate electrode and formed apart from the high concentration source and drain layers; and
   low concentration source and drain layers of the reverse conductive type respectively surrounding said high concentration source layer and said high concentration drain layer;
   wherein the low concentration source and drain layers are separated from each other by the body layer; and
   wherein the body layer is in direct contact with the low concentration source and drain layers such that the body layer protrudes from the low concentration source and drain layers in a downward direction.

6. The semiconductor device of claim 5 wherein said low concentration source and drain layers are shallow under said gate electrode and deep under said high concentration source and drain layers.

7. The semiconductor device of claim 5 further comprising a gate oxide film above the body layer, wherein the body layer is in direct contact with the gate oxide film.

8. The semiconductor device of claim 7 wherein the body layer has an approximately uniform width from the gate oxide film to a bottom surface of the body layer.

9. A semiconductor device comprising:
   high concentration source and drain layers of a reverse conductive type formed in a semiconductor layer of one conductive type;
   a gate electrode on a channel layer located between the high concentration source and drain layers and formed via a gate oxide film;
   a body layer of one conductive type formed only under the gate electrode and formed apart from the high concentration source and drain layers; and
   low concentration source and drain layers of the reverse conductive type respectively surrounding said high concentration source layer and said high concentration drain layer;
   wherein the low concentration source and drain layers are separated from each other by the body layer; and
   wherein the body layer is in direct contact with the low concentration source and drain layers along portions of each side of the body layer, and the body layer extends in a downward direction to a position below bottommost points of contact of the body layer with the low concentration source and drain layer.

* * * * *